(12) United States Patent
Sohn (10) Patent No.: US 7,579,890 B2
(45) Date of Patent: Aug. 25, 2009

(54) DUTY DETECTOR AND DUTY DETECTION/CORRECTION CIRCUIT INCLUDING THE SAME AND METHOD THEREOF

(75) Inventor: Young-soo Sohn, Gunpo-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/907,723

(22) Filed: Oct. 17, 2007

(65) Prior Publication Data

US 2008/0088350 A1    Apr. 17, 2008

(30) Foreign Application Priority Data

Oct. 17, 2006   (KR) ...................... 10-2006-0101023

(51) Int. Cl.
   *H03K 3/017*   (2006.01)
(52) U.S. Cl. ....................... 327/175; 327/172
(58) Field of Classification Search ........................ None
   See application file for complete search history.

(56) References Cited

U.S. PATENT DOCUMENTS

| | | | | |
|---|---|---|---|---|
| 5,572,158 A * | 11/1996 | Lee et al. | ..................... | 327/175 |
| 6,369,626 B1 * | 4/2002 | Donnelly et al. | ............ | 327/157 |
| 6,411,145 B1 * | 6/2002 | Kueng et al. | ................ | 327/175 |
| 6,539,072 B1 * | 3/2003 | Donnelly et al. | ............ | 375/371 |
| 6,833,743 B2 * | 12/2004 | Gu et al. | ...................... | 327/175 |
| 6,900,681 B2 * | 5/2005 | Takano | ........................ | 327/175 |
| 6,967,514 B2 * | 11/2005 | Kizer et al. | .................. | 327/175 |
| 7,015,739 B2 * | 3/2006 | Lee et al. | ..................... | 327/175 |
| 7,088,160 B2 * | 8/2006 | Harms et al. | ................. | 327/175 |
| 7,199,634 B2 * | 4/2007 | Cho et al. | .................... | 327/175 |
| 7,307,461 B2 * | 12/2007 | Nguyen et al. | .............. | 327/172 |
| 2006/0097795 A1 * | 5/2006 | Sohn | ........................... | 331/16 |
| 2007/0146011 A1 * | 6/2007 | O'Mahony et al. | ............ | 326/93 |

FOREIGN PATENT DOCUMENTS

| JP | 2004-297404 | 10/2004 |
|---|---|---|
| KR | 1020030052650 A | 6/2003 |
| KR | 1020050006885 A | 1/2005 |

* cited by examiner

*Primary Examiner*—Cassandra Cox
(74) *Attorney, Agent, or Firm*—Harness, Dickey & Pierce, P.L.C.

(57) ABSTRACT

A duty detector may include a first amplifier and/or an integrator. The first amplifier may be configured to receive a first signal and a complementary first signal, differential-amplify the first signal and the complementary first signal, and/or output the differential-amplified first signal to an output terminal and the differential-amplified complementary first signal to a complementary output terminal. The integrator may be connected to the output terminal and the complementary output terminal of the first amplifier, configured to integrate the differential-amplified first signal and the differential-amplified complementary first signal, and/or configured to output a duty detection signal.

25 Claims, 5 Drawing Sheets

DUTY DETECTOR AND DUTY DETECTION/CORRECTION CIRCUIT INCLUDING THE SAME AND METHOD THEREOF

PRIORITY STATEMENT

This application claims the benefit of priority to Korean Patent Application No. 10-2006-0101023, filed on Oct. 17, 2006, in the Korean Intellectual Property Office, the entire contents of which are incorporated herein in their entirety by reference.

BACKGROUND

1. Field

Example embodiments relate to a semiconductor integrated circuit and/or method thereof, and for example, to a duty detector that may detect the duty cycle of an input clock signal and/or a duty detection/correction circuit including the duty detector and/or a method thereof.

2. Description of Related Art

A duty cycle of a clock signal represents the ratio of a pulse width to a pulse cycle of the clock signal. In general, devices using a digital clock signal, for example, semiconductor integrated circuits, use a clock signal having a 50% duty cycle. The 50% duty cycle means that the width of a high level period of the clock signal is identical to the width a low level period of the clock signal. A duty detection/correction circuit converts a clock signal with a duty cycle that is not 50% into a clock signal having a 50% duty cycle.

A goal of semiconductor devices is to accurately control the duty cycle of a clock signal in digital clock applications. Accurate control of the duty cycle of a clock signal in digital clock applications is generally more important for synchronous semiconductor devices that input and output data in synchronization with a clock signal because the data may be distorted if the duty cycle of the clock signal is not correctly controlled.

A double data rate (DDR) synchronous semiconductor device has been more recently used in order to improve an operating speed. In a DDR synchronous semiconductor device, data is input/output at falling edges as well as rising edges of a clock signal, and the duty cycle of the clock signal is generally one important feature of the DDR synchronous semiconductor device.

Figure 1:
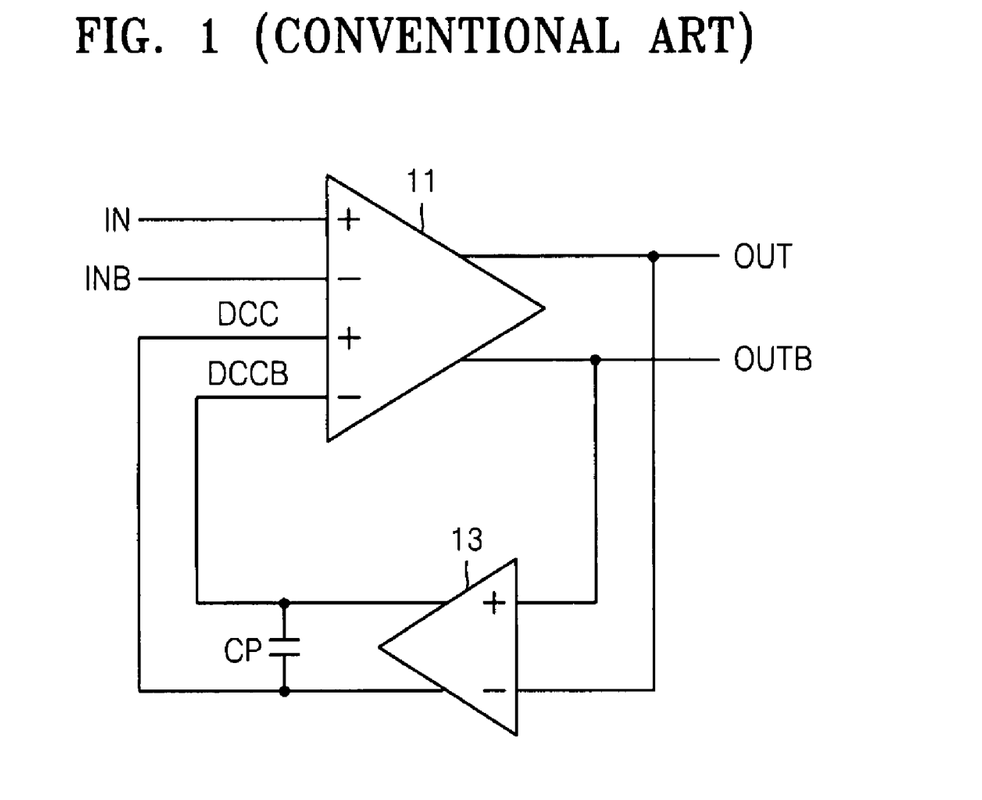
FIG. 1 is a circuit diagram of a conventional duty detection/correction circuit.

FIG. 1 is a circuit diagram of a conventional duty detection/correction circuit. Referring to FIG. 1, the conventional duty detection/correction circuit includes a duty corrector 11 and a duty detector 13. The duty corrector 11 corrects the duty cycle of an input clock signal IN and a complementary input clock signal INB in response to a duty detection signal DCC and a complementary duty detection signal DCCB output from the duty detector 13. In general, the duty corrector 11 is configured in the form of a differential amplifier and controls a duty cycle according to a DC offset applied to the differential amplifier. The duty detector 13 is configured in the form of a differential charge pump circuit, detects the duty cycle of an output clock signal OUT and a complementary output clock signal OUTB of the duty corrector 11, and outputs the duty detection signal DCC and the complementary duty detection signal DCCB. A capacitor CP is coupled between the outputs of the duty detector 13.

Figure 2:
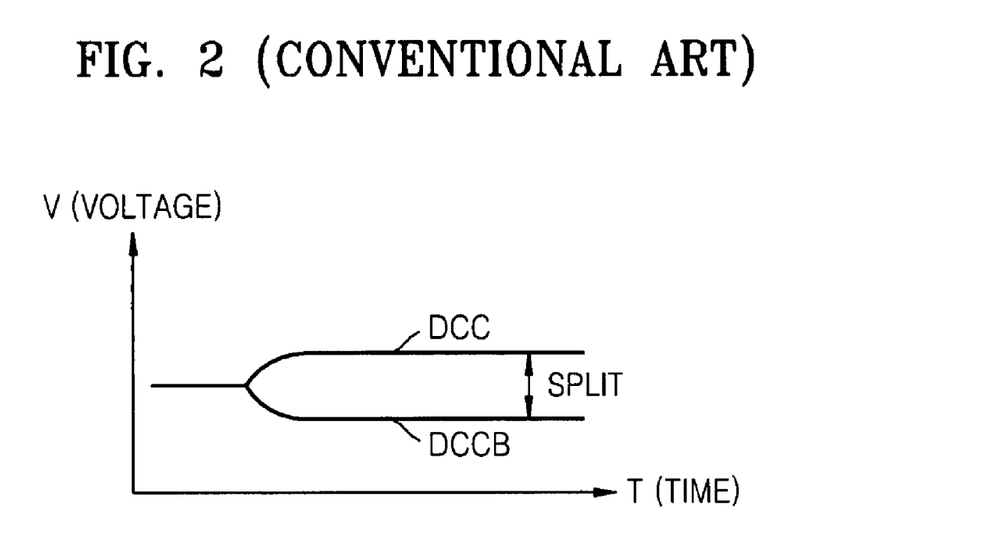
FIG. 2 illustrates the waveform of a duty detection signal and a complementary duty detection signal output from a conventional duty detector illustrated in FIG. 1.

FIG. 2 illustrates the waveform of the duty detection signal DCC and the complementary duty detection signal DCCB illustrated in FIG. 1. The duty detector 13 determines whether the duty cycle of the output clock signal OUT and the complementary output clock signal OUTB of the duty corrector 11 is higher or lower than 50% and outputs the duty detection signal DCC and the complementary duty detection signal DCCB. If the output clock signal OUT and the complementary output clock signal OUTB do not have a 50% duty cycle, a split is generated between the duty detection signal DCC and the complementary duty detection signal DCCB. The splitting operation is stopped if the duty cycle becomes 50%.

Figure 3:
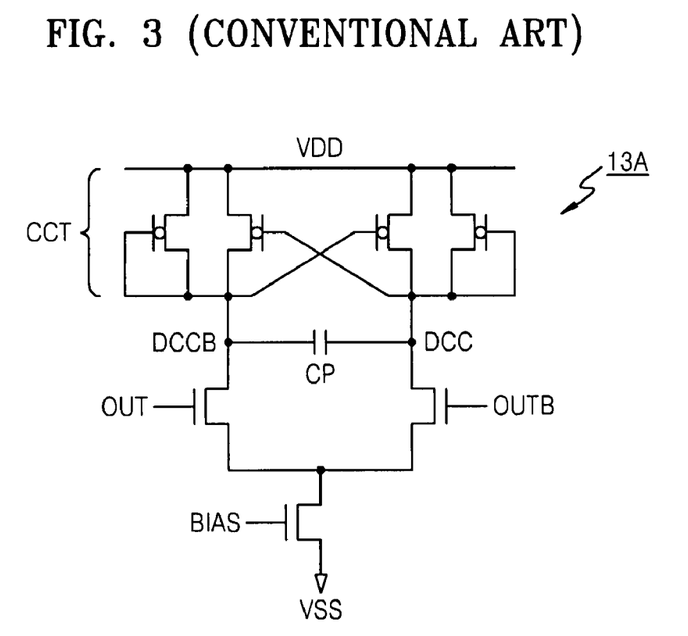
FIG. 3 is a circuit diagram of an implementation of a duty detector illustrated in FIG. 1.

FIG. 3 is a circuit diagram of a differential charge pump circuit 13A using a cross-coupled load implemented as the duty detector 13. Referring to FIG. 3, the differential charge pump circuit 13A uses cross-coupled transistors CCT as a load. The cross-coupled load, which is connected between a power supply VDD and output terminals OT1 and OT2, is used to supply a uniform load current to the output terminals OT1 and OT2 through which the duty detection signal DCC and the complementary duty detection signal DCCB are respectively output at any time. A capacitor CP is connected between the output terminals OT1 and OT2. Input transistors IT1 and IT2 receive the output clock signal OUT and the complementary output clock signal OUTB, respectively, and are respectively coupled between the output terminals OT1 and OT2 and a bias transistor BT receiving a bias signal BIAS. The bias transistor BT receiving the BIAS signal may be coupled between each of the input transistors IT1 and IT2 and a ground voltage VSS.

However, a drain-source voltage of the cross-coupled transistor connected to the output terminal OT1 outputting the duty detection signal DCC becomes different from a drain-source voltage of the cross-coupled transistor connected to the output terminal OT2 outputting the complementary duty detection signal DCCB if a split is generated between the duty detection signal DCC and the complementary duty detection signal DCCB because the output impedances of the cross-coupled transistors CCT used as a load are not infinite. Therefore, a load current supplied to the duty detection signal output terminal OT1 becomes different from a load current provided to the complementary duty detection signal output terminal OT2.

Accordingly, a split is not further generated between the duty detection signal DCC and the complementary duty detection signal DCCB after the duty detection signal DCC and the complementary duty detection signal DCCB are split from each other to some degree even if the output clock signal OUT and the complementary output clock signal OUTB do not have a 50% duty cycle. For example, if an input clock signal IN with a 45% duty cycle is input to the duty detection/correction circuit illustrated in FIG. 1, the duty detector 13A must continuously carry out the splitting operation until the duty cycle of the output clock signal OUT becomes 50%. However, the duty detector 13A stops the splitting operation although the output clock signal OUT do not have a 50% duty cycle. Accordingly, the performance of the duty detector 13A is deteriorated, and the duty correction capability of the duty detection/correction circuit illustrated in FIG. 1 is decreased.

Figure 4:
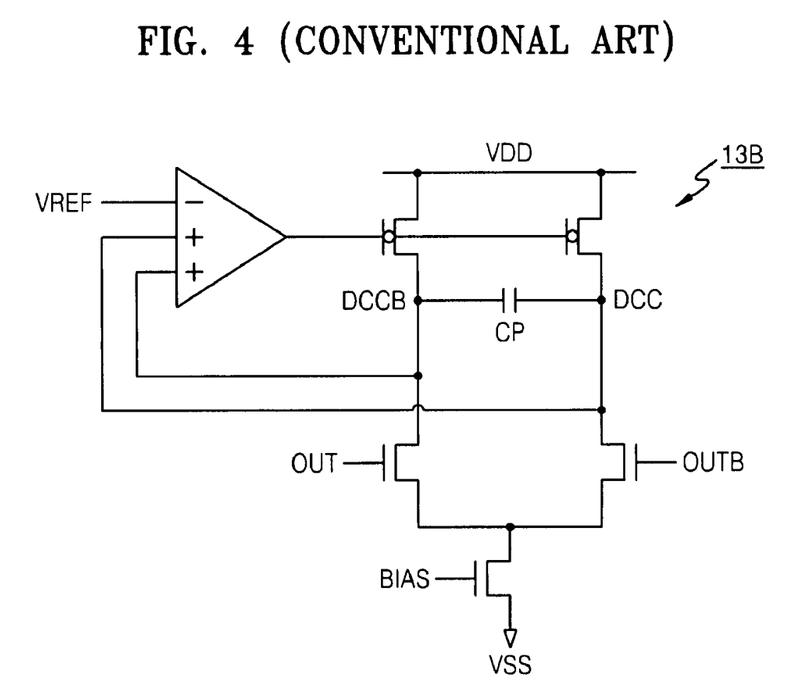
FIG. 4 is a circuit diagram of another implementation of the duty detector illustrated in FIG. 1.

FIG. 4 is a circuit diagram of a differential charge pump circuit 13B using a common mode feedback bias as another implementation of the duty detector 13 illustrated in FIG. 1. However, this differential charge pump circuit is difficult to design and has a restricted operating range because it uses the common mode feedback bias.

SUMMARY

Example embodiments may provide a duty detector for improving splitting performance without using a cross-coupled load or a common mode feedback bias to improve duty correction capability and/or a method thereof.

Example embodiments may provide a duty detection/correction circuit including the duty detector and/or a method thereof.

According to an example embodiment a duty detector may include a first amplifier and/or an integrator. The first amplifier may be configured to receive a first signal and a complementary first signal, differential-amplify the first signal and the complementary first signal, and/or output the differential-amplified first signal to an output terminal and the differential-amplified complementary first signal to a complementary output terminal. The integrator may be connected to the output terminal and the complementary output terminal of the first amplifier, configured to integrate the differential-amplified first signal and the differential-amplified complementary first signal, and/or configured to output a duty detection signal.

According to an example embodiment the duty detector may include a comparator configured to compare one of the differential-amplified first signal and the differential-amplified complementary first signal to a reference voltage and/or control a load of the first amplifier in response to the comparison result.

According to an example embodiment, a duty detection/correction circuit may include a duty corrector and/or the duty detector. The duty corrector may be configured to correct the duty cycle of an input clock signal in response to the duty detection signal and/or output the first signal and the complementary first signal. The duty detector may be configured to detect the duty cycle of the first signal and/or output the duty detection signal.

According to an example embodiment, a duty detection/correction circuit may include a duty corrector and/or the duty detector. The duty corrector may be configured to correct the duty cycle of an input clock signal in response to the duty detection signal and/or output the first signal and the complementary first signal. The duty detector may be configured to detect the duty cycle of the first signal and/or output the duty detection signal. The duty detector may include a comparator configured to compare one of the differential-amplified first signal and the differential-amplified complementary first signal to a reference voltage and/or control a load of the first amplifier in response to the comparison result.

According to an example embodiment, a method of detecting a duty cycle of a first signal may include receiving the first signal and a complementary first signal. The first signal and the complementary first signal may be differential-amplified. The differential-amplified first signal and the differential-amplified complementary first signal may be integrated. A duty detection signal may be output as a result of the integration.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 5:
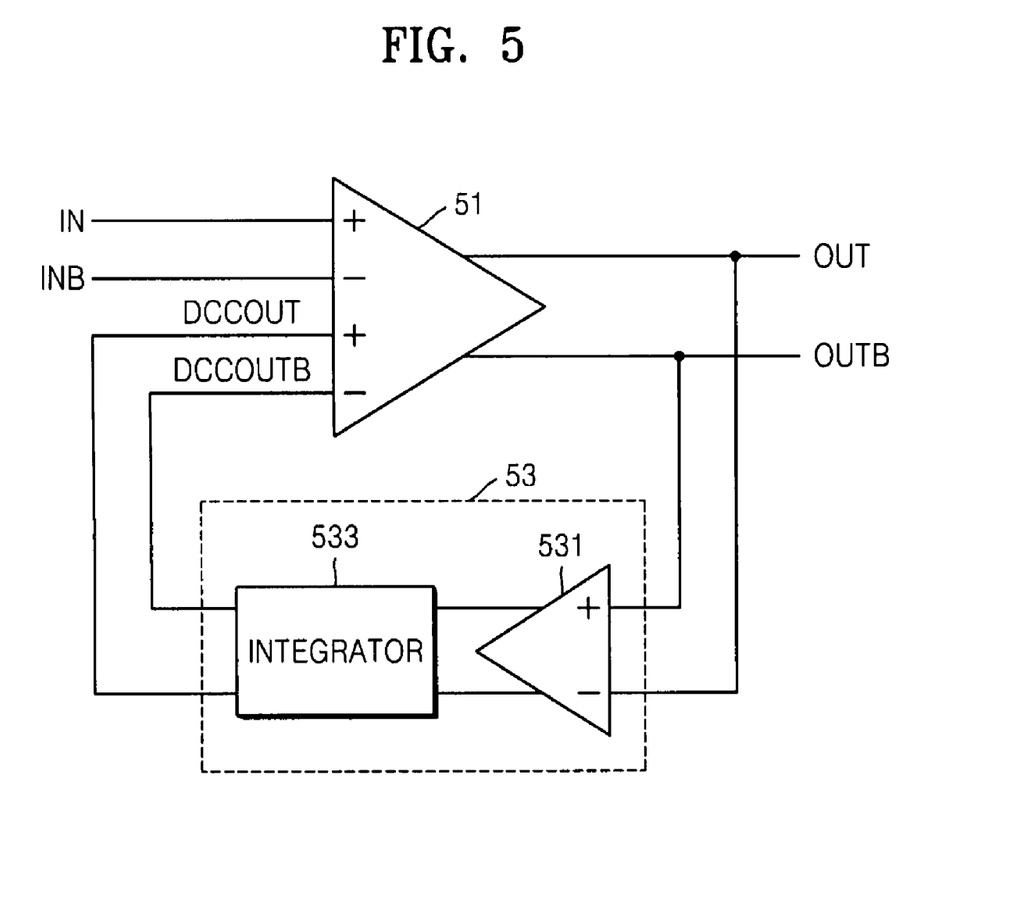
FIG. 5 illustrates a configuration of a duty detection/correction circuit according to an example embodiment.

FIG. 5 illustrates a configuration of a duty detection/correction circuit according to an example embodiment. Referring to FIG. 5, the duty detection/correction circuit may include a duty corrector 51 configured to correct the duty cycle of an input clock signal IN and/or a complementary input clock signal INB in response to a duty detection signal DCCOUT and/or a complementary duty detection signal DCCOUTB, and/or a duty detector 53 configured to detect the duty cycle of an output clock signal OUT and/or a complementary output clock signal OUTB of the duty corrector 51 and/or output the duty detection signal DCCOUT and/or the complementary duty detection signal DCCOUTB.

The duty corrector 51 may be configured in the form of a differential amplifier and/or may control the duty cycle according to DC offset applied to the differential amplifier. The duty corrector 51 is well known in the art, and a detailed explanation thereof is therefore omitted.

The duty detector 53 may be configured in the form of a differential charge pump. The duty detector 53 may include a first amplifier 531 receiving the output clock signal OUT and/or the complementary output clock signal OUTB of the duty corrector 51 and differential-amplifying the received signals, and/or an integrator 533 integrating the signals respectively output from an output terminal and a complementary output terminal of the first amplifier 531.

Figure 6:
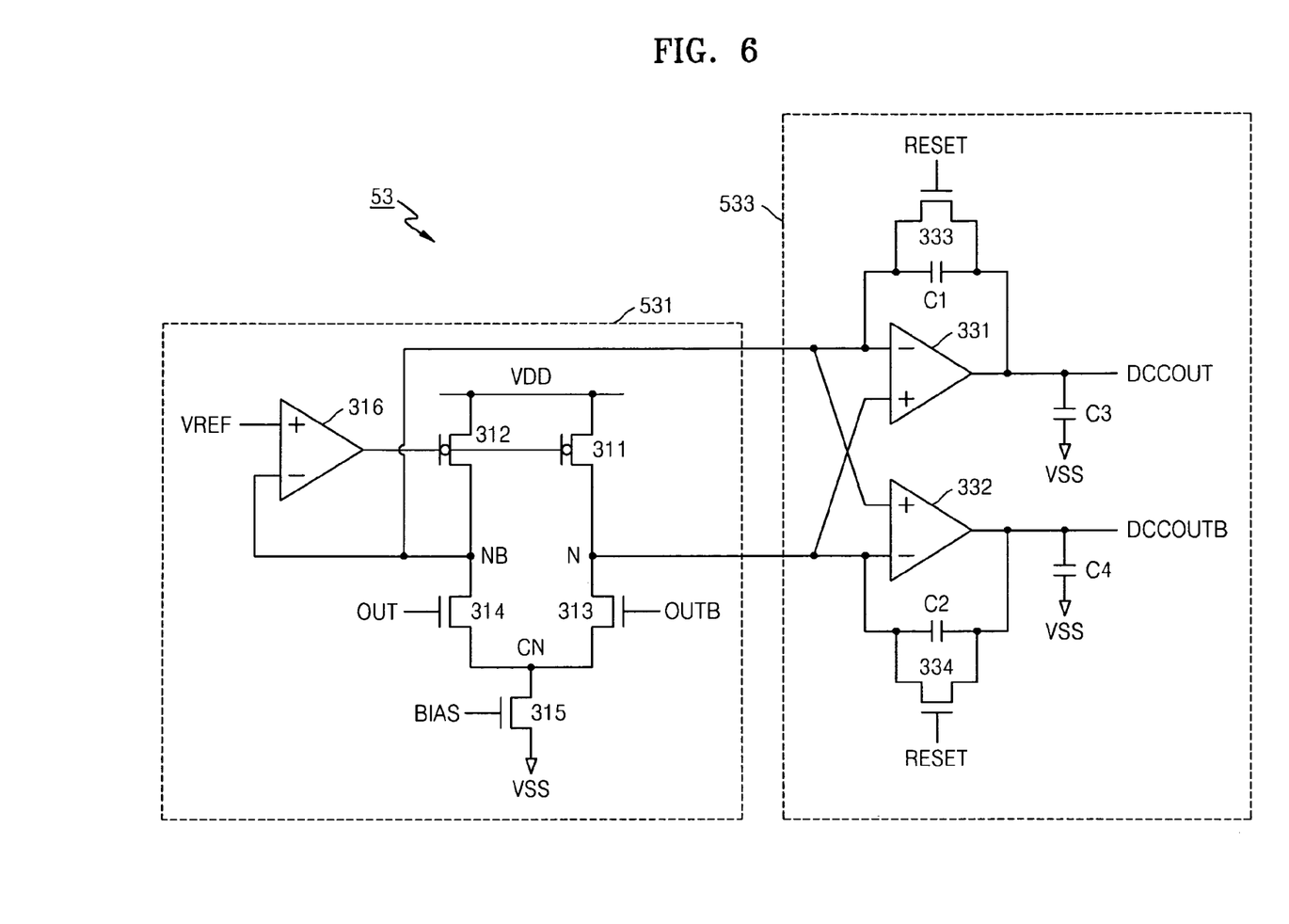
FIG. 6 is a circuit diagram of a duty detector illustrated in FIG. 5.

FIG. 6 is a circuit diagram of the duty detector 53 illustrated in FIG. 5. Referring to FIG. 6, the first amplifier 531 may include a first load transistor 311, a second load transistor 312, a first input transistor 313, a second input transistor 314, a bias transistor 315, and/or a comparator 316.

The first load transistor 311 may be coupled between a power supply voltage source VDD and the output terminal N of the first amplifier 531, and/or the second load transistor 312 may be coupled between the power supply voltage source VDD and the complementary output terminal NB of the first amplifier 531. The first input transistor 313 may be connected between the output terminal N of the first amplifier 531 and a common node CN and/or have a gate, receiving the complementary output clock signal OUTB of the duty corrector 51 illustrated in FIG. 5. The second input transistor 314 may be connected between the complementary output terminal NB of the first amplifier 531 and the common node CN and/or have a gate receiving the output clock signal OUT of the duty corrector 51 illustrated in FIG. 5. The bias transistor 315 may be coupled between the common node CN and a ground voltage source VSS and/or have a gate receiving a bias signal BIAS. The first and second load transistors 311 and 312 may be PMOS transistors and the first input transistor, the second input transistor 314 and the bias transistor 315 may be NMOS transistors, however, example embodiments are not limited thereto.

The comparator 316 may compare the signal of the complementary output terminal NB to a reference voltage VREF and/or output a signal to the gates of the first and second load transistors 311 and 312. For example, the comparator 316 may compare the signal of the complementary output terminal NB of the first amplifier 531 to the reference voltage VREF and/or control the first and second load transistors 311 and 312 according to the comparison result. However, example embodiments are not limited thereto, and the comparator 316 may instead compare the signal of the output terminal N of the first amplifier 531 to the reference voltage VREF and/or control the first and second load transistors 311 and 312 according to the comparison result.

The integrator 533 may include a second amplifier 331, a third amplifier 332, a first capacitor C1, a second capacitor C2, a third capacitor C3, a fourth capacitor C4, a first reset transistor 333, and/or a second reset transistor 334.

The second amplifier 331 may receive the signal of the output terminal N of the first amplifier 531 through a positive input terminal (+), receive the signal of the complementary output terminal NB of the first amplifier 531 through a negative input terminal (−), differential-amplify the received two signals, and/or output the duty detection signal DCCOUT as a result of the amplification. The third amplifier 332 may receive the signal of the complementary output terminal NB of the first amplifier 531 through a positive input terminal (+), receive the signal of the output terminal N of the first amplifier 531 through a negative input terminal (−), differential-amplify the received two signals, and output the complementary duty detection signal DCCOUTB as a result of the amplification.

The first capacitor C1 may be coupled between the negative input terminal (−) of the second amplifier 331 and the output terminal of the second amplifier 331, and/or the second capacitor C2 may be coupled between the negative input terminal (−) of the third amplifier 332 and the output terminal of the third amplifier 332. The third capacitor C3 may be coupled between the output terminal of the second amplifier 331 the ground source voltage VSS, and/or the fourth capacitor C4 may be coupled between the output terminal of the third amplifier 332 and the ground source voltage VSS. The third and fourth capacitors C3 and C4 may have capacitances larger than those of the first and second capacitors C1 and C2.

The first reset transistor 333 may be connected in parallel with the first capacitor C1 and may be controlled by a reset signal RESET. The second reset transistor 334 may be connected in parallel with the second capacitor C2 and may be controlled by the reset signal RESET. The first and second reset transistors 333 and 334 may be NMOS transistors, however, example embodiments are not limited thereto.

The duty detector 53 may use a single output feedback bias instead of a common mode feedback bias to control the load transistors 311 and 312 of the first amplifier 531, e.g., as illustrated in FIG. 6. For example, the comparator 316 may receive one of the signal of the output terminal N of the first amplifier 531 and the signal of the complementary output terminal NB (e.g., the comparator 316 receives the signal of the complementary output terminal NB in FIG. 6, however, example embodiments are not limited thereto and the comparator 316 may instead receive the signal of the output terminal N), compare the received signal to the reference voltage VREF, and/or control the load transistors 311 and 312 according to the comparison result.

If the single output feedback bias is used, a load current supplied to the output terminal N of the first amplifier 531 may become different from a load current supplied to the complementary output terminal NB of the first amplifier 531 if a split is generated between the signal of the output terminal N and the signal of the complementary output terminal NB. Therefore, the duty detector 53 may include the integrator 533 connected to the output terminal N and the complementary output terminal NB of the first amplifier 531.

The integrator 533 may charge the output terminals outputting the duty detection signal DCCOUT and the complementary duty detection signal DCCOUTB with a current generated by a charge pumping operation and/or discharge the current while maintaining the level of the signal of the output terminal N of the first amplifier 531 identical to the level of the signal of the complementary output terminal NB of the first amplifier 531. Accordingly, a split may not be generated between the signal of the output terminal N and the signal of the complementary output terminal NB of the first amplifier 531, and the two signals may have the same level at all times due to the integrator 533. Accordingly, even if the single output feedback bias is used in order to control the load transistors 311 and 312 of the first amplifier 531, the same effect as if the common mode feedback bias is used may be achieved.

Furthermore, the integrator 533 may cause the signal of the output terminal N of the first amplifier 531 to have the same level as the signal of the complementary output terminal NB of the first amplifier 531 at all times, and/or the load current supplied to the output terminal N may become equal to the load current supplied to the complementary output terminal NB. Accordingly, the performance of the duty detector 53 may be improved, and/or the duty correction capability of the duty detection/correction circuit illustrated in FIG. 5 may be enhanced.

Figure 7:
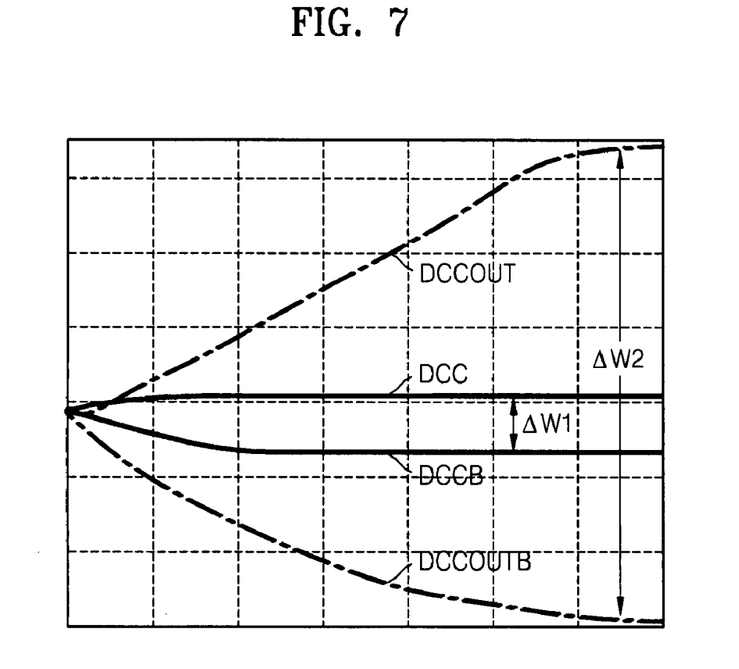
FIG. 7 is an example graph representing results of example simulations performed in an open loop state for the duty detector according to an example embodiment illustrated in FIG. 6 and the conventional duty detector illustrated in FIG. 3.

FIG. 7 is an example graph representing results of example simulations performed in an open loop state for the duty detector according to an example embodiment illustrated in FIG. 6 and the conventional duty detector 13 illustrated in FIG. 3. In FIG. 7, DCC and DCCB represent output signals of the conventional duty detector 13 illustrated in FIG. 3 and the duty detection signal DCCOUT and the complementary duty detection signal DCCOUB represent output signals of the duty detector 53 illustrated in FIG. 6.

If a clock signal (not shown) with a duty cycle that is not 50% is input, a load current supplied to the DCC output terminal becomes different from a load current supplied to the DCCB output terminal if a split Δw1 is generated between the output signals DCC and DCCB, and splitting is therefore stopped in the conventional duty detector. In the duty detector 53 according to the example embodiments, the signal of the output terminal N and the signal of the complementary output terminal NB of the first amplifier 531 may have the same level all the time (e.g., have no split), and the same specific load current may therefore be supplied to the output terminal N and the complementary output terminal NB of the first amplifier 531. Accordingly, a split ΔW2 may be continuously generated between the output signals DCCOUT and DCCOUTB of the duty detector 53.

Figure 8:
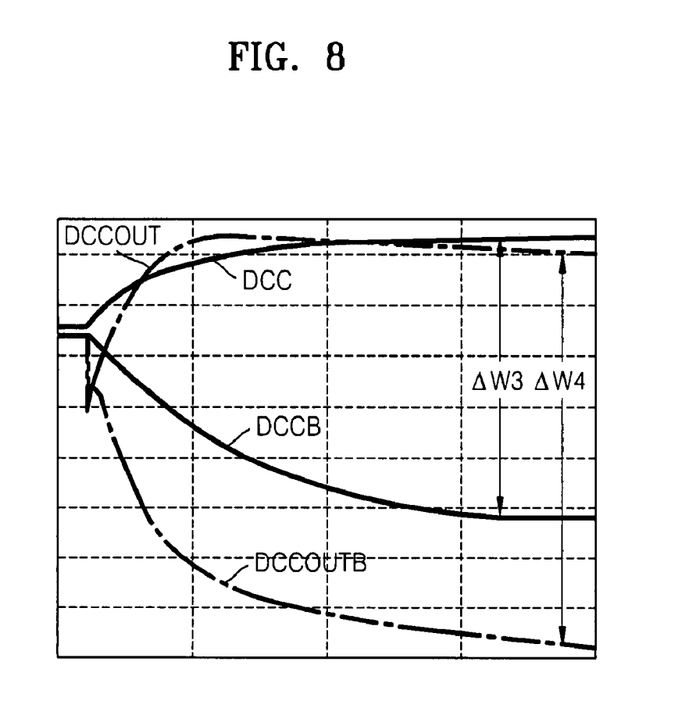
FIG. 8 is an example graph representing results of example simulations performed in a closed loop state for the duty detector according to an example embodiment illustrated in FIG. 6 and the conventional duty detector illustrated in FIG. 3.

FIG. 8 is an example graph representing results of example simulations performed in a closed loop state (e.g., the duty detector is connected to the duty corrector) for the duty detector 53 according to an example embodiment illustrated in FIG. 6 and the conventional duty detector 13 illustrated in FIG. 3. In FIG. 8, DCC and DCCB represent output signals of the conventional duty detector 13 illustrated in FIG. 3 and the duty detection signal DCCOUT and the complementary duty detection signal DCCOUTB represent output signals of the duty detector 53 illustrated in FIG. 6.

If a clock signal (not shown) with a duty cycle that is not 50% is input, the duty correction capability may be improved if a large split is generated between the output signals of the duty detector. As illustrated in FIG. 8, a split ΔW4 of approximately 150 mV may be generated between the output signals DCCOUT and DCCOUTB in the duty detector 53 according to an example embodiment while a split ΔW3 of approximately 100 mV is generated between the output signals DCC and DCCB in the conventional duty detector. Accordingly, the duty correction capability may be improved by using the duty detector according to example embodiments.

As described above, the duty detector according to example embodiments may use a single output feedback bias and/or an integrator without using a cross-coupled load or a common mode feedback bias. Accordingly, split performance may be improved and the duty correction capability of the duty detection/correction circuit including the duty detector may be enhanced.

Although example embodiments have been shown and described in this specification and figures, it would be appreciated by those skilled in the art that changes may be made to the illustrated and/or described example embodiments without departing from their principles and spirit.

What is claimed is:

1. A duty detector, comprising:
a first amplifier configured to receive a first signal and a complementary first signal, differential-amplify the first signal and the complementary first signal, and output the differential-amplified first signal to an output terminal and the differential-amplified complementary first signal to a complementary output terminal; and
an integrator connected to the output terminal and the complementary output terminal of the first amplifier, configured to integrate the differential-amplified first signal and the differential-amplified complementary first signal, and configured to output a duty detection signal, wherein the integrator includes,
a second amplifier configured to receive the differential-amplified first signal through a positive input terminal, receive the differential-amplified complementary first signal through a negative input terminal, differential-amplify the received signals, and output the duty detection signal,
a third amplifier configured to receive the differential-amplified complementary first signal through a positive input terminal, receive the differential-amplified first signal through a negative input terminal, differential-amplify the received signals, and output a complementary duty detection signal,
a first capacitor coupled between the negative input terminal of the second amplifier and an output terminal of the second amplifier,
a second capacitor coupled between the negative input terminal of the third amplifier and an output terminal of the third amplifier,
a third capacitor coupled to the output terminal of the second amplifier, and
a fourth capacitor coupled to the output terminal of the third amplifier.

2. The duty detector of claim 1, wherein the integrator comprises:
a first reset transistor connected in parallel with the first capacitor; and
a second reset transistor connected in parallel with the second capacitor.

3. The duty detector of claim 1, wherein the third and fourth capacitors have capacitances larger than capacitances of the first and second capacitors.

4. The duty detector of claim 1, wherein the first amplifier comprises:
- a first load transistor coupled between a power supply voltage source and the output terminal of the first amplifier;
- a second load transistor coupled between the power supply voltage source and the complementary output terminal of the first amplifier;
- a first input transistor coupled between the output terminal of the first amplifier and a common node, the first input transistor including a gate configured to receive the complementary first signal;
- a second input transistor coupled between the complementary output terminal of the first amplifier and the common node, the second input transistor including a gate configured to receive the first signal; and
- a bias transistor coupled between the common node and a ground voltage source, the bias transistor including a gate configured to receive a bias signal.

5. The duty detector of claim 4, wherein the first amplifier comprises:
- a comparator configured to compare one of the differential-amplified first signal and the differential-amplified complementary first signal to a reference voltage, wherein an output signal of the comparator is applied to the gates of the first and second load transistors.

6. A duty detector comprising:
- a first amplifier configured to receive a first signal and a complementary first signal, differential-amplify the first signal and the complementary first signal, and output the differential-amplified first signal to an output terminal and the differential-amplified complementary first signal to a complementary output terminal:
- an integrator connected to the output terminal and the complementary output terminal of the first amplifier, configured to integrate the differential-amplified first signal and the differential-amplified complementary first signal, and configured to output a duty detection signal; and
- a comparator configured to compare one of the differential-amplified first signal and the differential-amplified complementary first signal to a reference voltage and control a load of the first amplifier in response to the comparison result.

7. The duty detector of claim 6, wherein the integrator comprises:
- a second amplifier configured to receive the differential-amplified first signal through a positive input terminal, receive the differential-amplified complementary first signal through a negative input terminal, differential-amplify the received signals, and output the duty detection signal;
- a third amplifier configured to receive the differential-amplified complementary first signal through a positive input terminal, receive the differential-amplified first signal through a negative input terminal, differential-amplify the received signals, and output a complementary duty detection signal;
- a first capacitor coupled between the negative input terminal of the second amplifier and an output terminal of the second amplifier;
- a second capacitor coupled between the negative input terminal of the third amplifier and an output terminal of the third amplifier;
- a third capacitor coupled to the output terminal of the second amplifier; and
- a fourth capacitor coupled to the output terminal of the third amplifier.

8. The duty detector of claim 7, wherein the integrator comprises:
- a first reset transistor connected in parallel with the first capacitor; and
- a second reset transistor connected in parallel with the second capacitor.

9. The duty detector of claim 7, wherein the third and fourth capacitors have capacitances larger than capacitances of the first and second capacitors.

10. The duty detector of claim 6, wherein the first amplifier comprises:
- a first load transistor coupled between a power supply voltage source and the output terminal of the first amplifier, the first load transistor including a gate configured to receive the comparison result of the comparator;
- a second load transistor coupled between the power supply voltage source and the complementary output terminal of the first amplifier, the second load transistor including a gate configured to receive the comparison result of the comparator;
- a first input transistor coupled between the output terminal of the first amplifier and a common node, the first input transistor including a gate configured to receive the complementary first signal;
- a second input transistor coupled between the complementary output terminal of the first amplifier and the common node, the second input transistor including a gate configured to receive the first signal; and
- a bias transistor coupled between the common node and a ground voltage source, the bias transistor including a gate configured to receive a bias signal.

11. A duty detection/correction circuit comprising:
- a duty corrector configured to correct a duty cycle of an input clock signal in response to a duty detection signal and output a first signal and a complementary first signal; and
- a duty detector configured to detect the duty cycle of the first signal and output the duty detection signal, the duty detector including,
  - a first amplifier configured to receive the first signal and the complementary first signal, differential-amplify the first signal and the complementary first signal, and output the differential-amplified first signal to an output terminal and the differential-amplified complementary first signal to a complementary output terminal, and
  - an integrator connected to the output terminal and the complementary output terminal of the first amplifier, configured to integrate the differential-amplified first signal and the differential-amplified complementary first signal, and configured to output the duty detection signal.

12. The duty detection/correction circuit of claim 11, wherein the integrator comprises:
- a second amplifier configured to receive the differential-amplified first signal through a positive input terminal, receive the differential-amplified complementary first signal through a negative input terminal, differential-amplify the received signals, and output the duty detection signal;
- a third amplifier configured to receive the differential-amplified complementary first signal through a positive input terminal, receive the differential-amplified first signal through a negative input terminal, differential-amplify the received signals, and output a complementary duty detection signal;

a first capacitor coupled between the negative input terminal of the second amplifier and an output terminal of the second amplifier;

a second capacitor coupled between the negative input terminal of the third amplifier and an output terminal of the third amplifier;

a third capacitor coupled to the output terminal of the second amplifier; and a fourth capacitor coupled to the output terminal of the third amplifier.

13. The duty detection/correction circuit of claim 12, wherein the integrator comprises:
   a first reset transistor connected in parallel with the first capacitor; and
   a second reset transistor connected in parallel with the second capacitor.

14. The duty detection/correction circuit of claim 12, wherein the third and fourth capacitors have capacitances larger than capacitances of the first and second capacitors.

15. The duty detection/correction circuit of claim 11, wherein the first amplifier comprises:
   a first load transistor coupled between a power supply voltage source and the output terminal of the first amplifier;
   a second load transistor coupled between the power supply voltage source and the complementary output terminal of the first amplifier;
   a first input transistor coupled between the output terminal of the first amplifier and a common node, the first input transistor including a gate configured to receive the complementary first signal;
   a second input transistor coupled between the complementary output terminal of the first amplifier and the common node, the second input transistor including a gate configured to receive the first signal; and
   a bias transistor coupled between the common node and a ground voltage source, the bias transistor including a gate configured to receive a bias signal.

16. The duty detection/correction circuit of claim 15, wherein the first amplifier comprises:
   a comparator configured to compare one of the differential-amplified first signal and the differential-amplified complementary signal to a reference voltage, wherein an output signal of the comparator is applied to the gates of the first and second load transistors.

17. The duty detection/correction circuit of claim 11, wherein the duty corrector includes an amplifier.

18. The duty detection/correction circuit of claim 11, wherein the duty detector includes a differential charge pump.

19. A duty detection/correction circuit comprising:
   a duty corrector configured to correct a duty cycle of an input clock signal in response to a duty detection signal and output a first signal and a complementary first signal; and
   a duty detector configured to detect the duty cycle of the first signal and output the duty detection signal,
   wherein the duty detector includes,
      a first amplifier configured to receive the first signal and the complementary first signal, differential-amplify the first signal and the complementary first signal, and output the differential-amplified first signal to an output terminal and the differential-amplified complementary first signal to a complementary output terminal,
      an integrator connected to the output terminal and the complementary output terminal of the first amplifier, configured to integrate the differential-amplified first signal and the differential-amplified complementary first signal, and configured to output the duty detection signal, and
      a comparator configured to compare one of the differential-amplified first signal and the differential-amplified complementary first signal to a reference voltage and control a load of the first amplifier in response to the comparison result.

20. The duty detection/correction circuit of claim 19, wherein the integrator comprises:
   a second amplifier configured to receive the differential-amplified first signal through a positive input terminal, receive the differential-amplified complementary first signal through a negative input terminal, differential-amplify the received signals, and output the duty detection signal;
   a third amplifier configured to receive the differential-amplified complementary first signal through a positive input terminal, receive the differential-amplified first signal through a negative input terminal, differential-amplify the received signals, and output a complementary duty detection signal;
   a first capacitor coupled between the negative input terminal of the second amplifier and an output terminal of the second amplifier;
   a second capacitor coupled between the negative input terminal of the third amplifier and an output terminal of the third amplifier;
   a third capacitor coupled to the output terminal of the second amplifier; and
   a fourth capacitor coupled to the output terminal of the third amplifier.

21. The duty detection/correction circuit of claim 20, wherein the integrator comprises:
   a first reset transistor connected in parallel with the first capacitor; and
   a second reset transistor connected in parallel with the second capacitor.

22. The duty detection/correction circuit of claim 20, wherein the third and fourth capacitors have capacitances larger than capacitances of the first and second capacitors.

23. The duty detection/correction circuit of claim 19, wherein the first amplifier comprises:
   a first load transistor coupled between a power supply voltage source and the output terminal of the first amplifier, the first load transistor including a gate configured to receive the comparison result of the comparator;
   a second load transistor coupled between the power supply voltage source and the complementary output terminal of the first amplifier, the second load transistor including a gate configured to receive the comparison result of the comparator;
   a first input transistor coupled between the output terminal of the first amplifier and a common node, the first input transistor including a gate configured to receive the complementary first signal;
   a second input transistor coupled between the complementary output terminal of the first amplifier and the common node, the second input transistor including a gate configured to receive the first signal; and a bias transistor coupled between the common node and a ground voltage source, the bias transistor including a gate configured to receive a bias signal.

24. The duty detection/correction circuit of claim 19, wherein the duty corrector includes an amplifier.

25. The duty detection/correction circuit of claim 19, wherein the duty detector includes a differential charge pump.

* * * * *